United States Patent
Kurotsuchi et al.

(10) Patent No.: US 7,123,535 B2
(45) Date of Patent: Oct. 17, 2006

(54) SEMICONDUCTOR INTEGRATED CIRCUIT DEVICE

(75) Inventors: Kenzo Kurotsuchi, Tokyo (JP); Norikatsu Takaura, Tokyo (JP); Osamu Tonomura, Tokyo (JP); Motoyasu Terao, Tokyo (JP); Hideyuki Matsuoka, Tokyo (JP); Riichiro Takemura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/002,245

(22) Filed: Dec. 3, 2004

(65) Prior Publication Data

US 2005/0128799 A1 Jun. 16, 2005

(30) Foreign Application Priority Data

Dec. 5, 2003 (JP) ............................. 2003-406802

(51) Int. Cl.
*G11C 17/18* (2006.01)
(52) U.S. Cl. ..................... 365/225.7; 365/148; 365/158
(58) Field of Classification Search ............. 365/225.7, 365/148, 158, 230.06, 226
See application file for complete search history.

(56) References Cited

U.S. PATENT DOCUMENTS

| | | | |
|---|---|---|---|
| 5,883,827 A | 3/1999 | Morgan | |
| 6,141,241 A | 10/2000 | Ovshinsky et al. | |
| 6,750,469 B1 | 6/2004 | Ichihara et al. | |
| 6,873,561 B1 * | 3/2005 | Ooishi | 365/226 |
| 2003/0067013 A1 | 4/2003 | Ichihara et al. | |
| 2004/0157427 A1* | 8/2004 | Motoyoshi | 438/622 |
| 2004/0208038 A1* | 10/2004 | Idehara | 365/100 |
| 2004/0240255 A1* | 12/2004 | Smith et al. | 365/158 |
| 2005/0105327 A1* | 5/2005 | Nazarian | 365/158 |

FOREIGN PATENT DOCUMENTS

| | | |
|---|---|---|
| JP | 2002-541613 | 12/2000 |
| JP | 2003-100085 | 9/2001 |
| WO | WO 00/62301 | 10/2000 |

* cited by examiner

*Primary Examiner*—Tuan T. Nguyen
*Assistant Examiner*—Dang Nguyen
(74) *Attorney, Agent, or Firm*—Miles & Stockbridge P.C.

(57) ABSTRACT

In a non-volatile phase change memory, information is recorded by utilizing a change in resistance of a phase change portion. When the phase change portion is allowed to generate Joule's heat and is held at a specific temperature, it goes into a state of a low resistance. When the gate voltage of a memory cell selection transistor QM is controlled to afford a low resistance state, the maximum amount of current applied to the phase change portion is limited by the application of a medium-state voltage to the control gate, thereby avoiding overheating of the phase change portion.

30 Claims, 10 Drawing Sheets

TIMING CHART OF READ OUT

IN CASE THAT THE MEMORY CELL IS IN "RESET" STATE

IN CASE THAT THE MEMORY CELL IS IN "SET" STATE

SEMICONDUCTOR INTEGRATED CIRCUIT DEVICE

CLAIM OF PRIORITY

The present invention claims priority from Japanese application JP2003-406802, filed on Dec. 5, 2003, the content of which is hereby incorporated by reference into this application.

BACKGROUND OF THE INVENTION

1. Field of the Invention

The present invention relates to a semiconductor integrated circuit device and more particularly to a technique applicable effectively to a high-density integrated memory circuit formed by using a phase change material, a logic mixed memory having a memory circuit and a logic circuit on one and same semiconductor substrate, or a semiconductor integrated circuit device having an analog circuit. Particularly, the present invention is concerned with a non-volatile high-speed random access memory.

2. Description of Related Art

The growth of the non-volatile memory market under the demand for mobile devices typified by portable telephones is remarkable. Typical of the non-volatile memory is FLASH memory, which, however, is used as a programmable ROM because the speed thereof is essentially low. On the other hand, as memory for works, a high-speed RAM is needed and both FLASH and DRAM memories are mounted on portable devices. If an element having the features of those two memories can be implemented, the impact thereof is extremely strong because not only it becomes possible to integrate both FLASH and DRAM memories into a single chip but also all the semiconductor memories are substituted thereby.

One candidate for implementing the said element is a non-volatile memory using a phase change film, which is described in detail, for example, in Patent Document 1. The phase change memory is sometimes called PRAM, OUM, or ovonic unified memory. In this memory, a crystal phase of a memory element changes in accordance with Joule's heat which is generated by an electric current flowing in the memory element itself, whereby storage information is written. Chalcogenide is used as the material of the storage element. Chalcogenide is a material containing at least one of sulfur, selenium, and tellurium.

Next, an operation principle of the phase change memory will now be described briefly. For amorphization of a phase change portion, as shown in FIG. 2, such a reset pulse as causes heating to a temperature above the melting point Tm of the chalcogenide material and subsequent quenching is applied to the phase change portion. The melting point Tm is, for example, 600° C. A quenching time t1 is, for example, 2 nsec. To crystallize the phase change portion, the temperature of the phase change portion is maintained locally at a temperature in the range from a crystallization temperature Tc to the melting point Tm. At this time, the temperature is, for example, 400° C. The time required for the crystallization differs depending on the composition of chalcogenide material used, but is 50 nsec for example. Crystallizing the phase change portion of the phase change memory cell will hereinafter be referred to as setting operation, while amorphizing the phase change portion will hereinafter be referred to as resetting operation.

The phase change memory is characteristic in that the resistance value of the phase change portion changes two to three orders of magnitude in accordance with the crystal phase and that since this resistance value is used as a signal, a read signal is large and a sensing operation becomes easier, thus resulting in the speed of read being high.

The following patents are here mentioned as documents related to a phase change memory rewrite method. First, the thinking that a constant current pulse is used for the rewrite of a phase change memory is described in U.S. Pat. No. 5,883,827 and Japanese Unexamined Patent Publication No. 2002-541613. Further, in Japanese Patent Laid-open No. 2003-100085, it is described that a sample state is read before rewrite and then rewrite is performed with an appropriate electric signal based on the result of the read and that the wave form of the electric signal is adjusted and the fall time of the electric signal is delayed for allowing the phase change portion to be cooled slowly at the time of crystallization, thereby permitting crystallization to take place stably.

To make the phase change memory perform its setting operation, the temperature of the phase change portion must be held in a constant range from its crystallization temperature to its melting point. However, if a constant voltage source is used, as shown in FIG. 3, the phase change portion crystallizes into a state of low resistance and a large current flows in accordance with the Ohm's law, so that the phase change portion is overheated. As a result, the temperature of the phase change portion exceeds its melting point and thereafter the phase change portion is quenched, whereby there again arises the possibility of amorphization. Thus, with the constant voltage source, it has so far been difficult to set the phase change memory stably.

SUMMARY OF THE INVENTION

To solve the above-mentioned problem, a three-level control method for a word voltage of a selection transistor connected in series to the phase change portion at the time of write is here proposed and will be described below.

In a resetting operation, as shown in FIG. 4, VDD is applied as a gate voltage to a selection transistor QM, allowing current sufficient to let the temperature of a phase change portion 1 rise above the melting point thereof to flow through the phase change portion, and a pulse voltage is applied to the selection transistor QM.

On the other hand, in a setting operation, as shown in FIG. 5, the gate voltage of the selection transistor QM is set, for example, at one half of VDD and a pulse voltage is applied. Before the setting operation, a phase change portion 2 is in an amorphous phase of high resistance and therefore almost all of the applied voltage is fed to the phase change portion. Upon occurrence of crystallization, the resistance of the phase change portion becomes lower, so that the amount of current increases. However, since the gate voltage of the selection transistor QM is low, the amount of current flowing through the phase change portion is limited, with the result that the phase change portion is not overheated and thus prevented from re-amorphization. As to the gate voltage applied to the selection transistor QM, it goes without saying that an optimum value is selected in view of the performance of the selection transistor and the composition of the phase change material.

A current mirror circuit may be used to prevent re-amorphization.

With a semiconductor integrated circuit device using the technique of the present invention, it is possible to implement a highly reliable a non-volatile semiconductor memory. If this device is mounted on one and same substrate

DESCRIPTION OF THE PREFERRED EMBODIMENTS

First Embodiment

Figure 1:
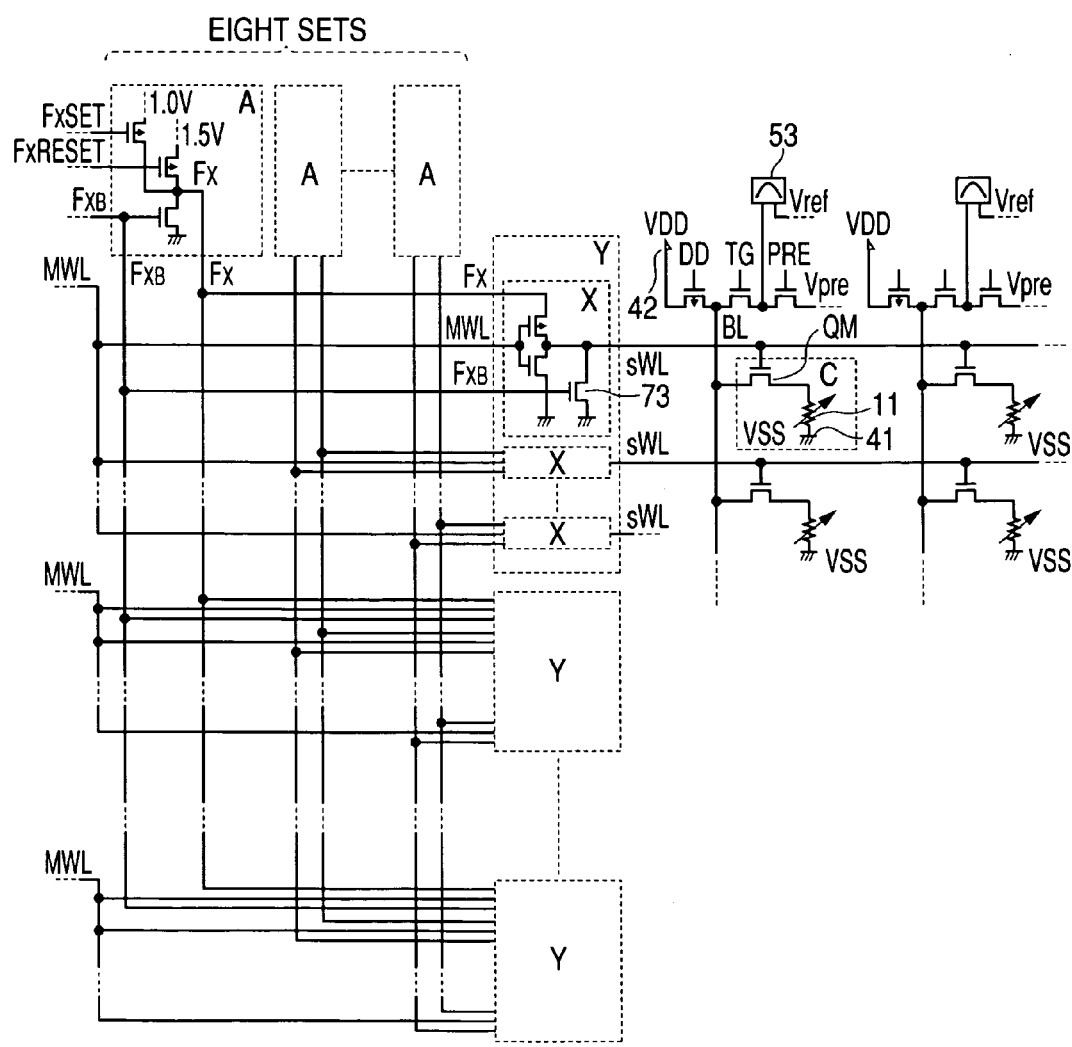
FIG. 1 shows a peripheral circuit portion and a memory array.
Figure 2:
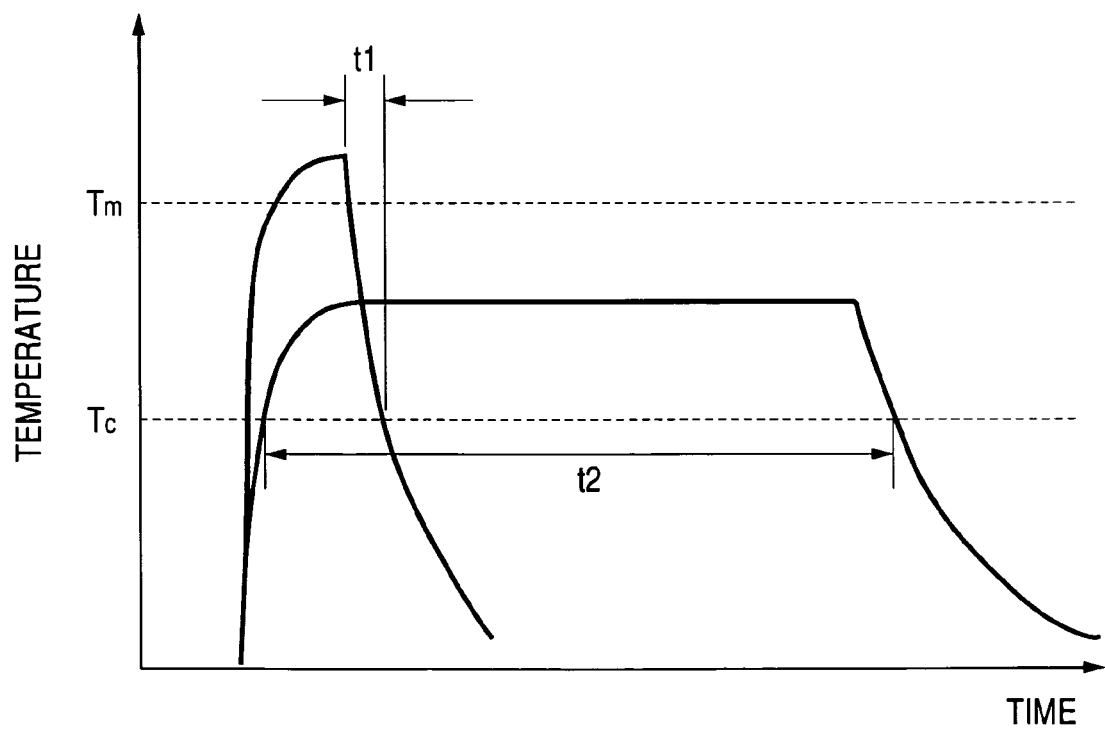
FIG. 2 shows a relation between pulse width and temperature necessary for phase change.
Figure 3:
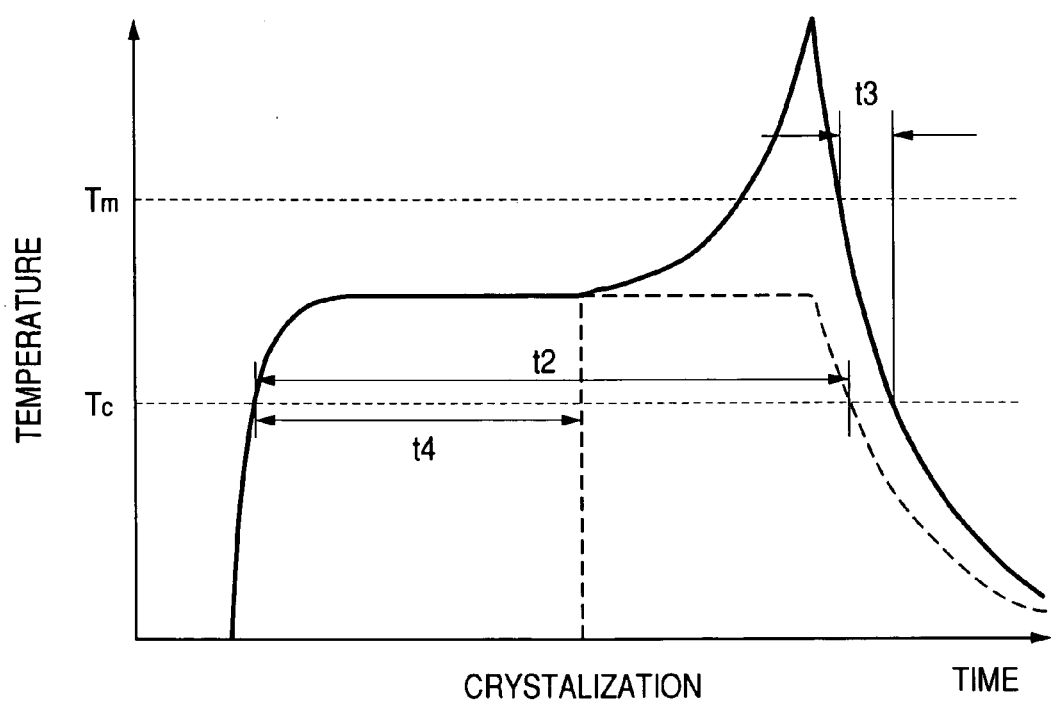
FIG. 3 shows an erroneous reset of a phase change portion caused by overheating.
Figure 4:
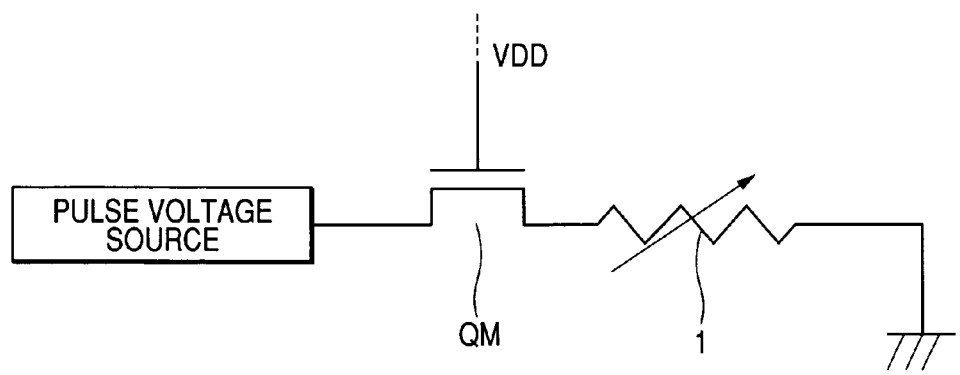
FIG. 4 shows a resetting operation.
Figure 5:
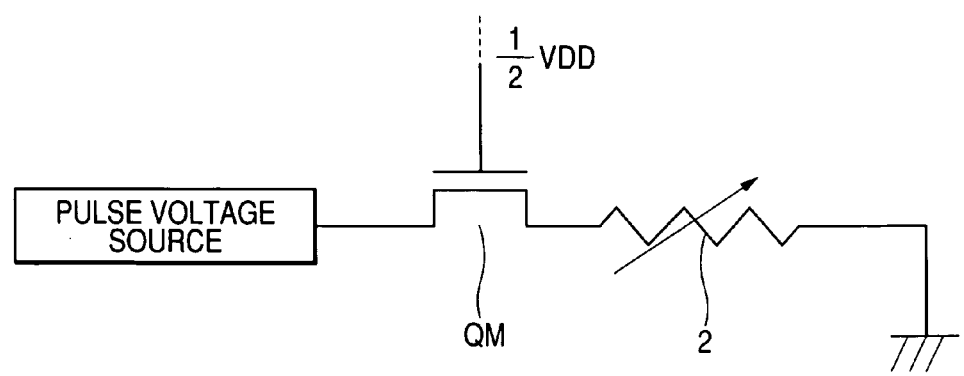
FIG. 5 shows a setting operation.

In this embodiment, how the memory array shown in FIG. 1 operates will be described in detail. A memory cell C is composed of one information storage portion and one selection transistor. The selection transistor is an MIS type transistor. Although only four memory cells are described in FIG. 1, this is because of simplification for showing the problem and the principle of the present invention. Circuit elements which constitute blocks in this embodiment, though not specially limited, are typically formed on such a single semiconductor substrate as a single crystal silicon by a semiconductor integrated circuit technology such as a known CMOS (a complementary MOS transistor). As the material of the information storage portion, there is used a phase change material, especially chalcogenide. A sub-word line driver Y drives eight sub-word lines sWL per piece. Thirty-two sub-word line drivers Y are arranged, while a total of 256 sub-word lines sWL are laid.

Prior to write, FXB, TG, and PRE, are at an increased potential, FXRESET, FXSET, FX, sWL, MWL, and DD, are at a ground potential VSS, and BL is held at a precharge potential Vpre.

To reset the memory cell C, FXB is deactivated, while FXRESET is activated, to increase the FX potential to 1.5V. Next, PRE and TG are deactivated and thereafter DD is activated, entering a stand-by mode. As a result, the potential of BL rises to VDD. Further, by activating MWL, the gate potential of the selection transistor QM increases from the ground potential to 1.5V, so that current flows from a power supply 42 to a common line 41 through a phase change portion 11 and the phase change portion 11 is heated with generated Joule's heat. Since a relatively high voltage of 1.5V is applied to the gate of the selection transistor QM, the source-drain resistance of the selection transistor QM is as low as 5 kΩ, and upon lapse of 10 nsec the temperature of the phase change portion 11 exceeds the melting point thereof. Next, MWL is deactivated to turn OFF the selection transistor QM. As a result, the phase change portion 11 is quenched into an amorphous phase. Then, DD is deactivated and thereafter TG and PRE are activated, whereby BL is fixed to a potential Vpre. Subsequently, FXRESET is deactivated and FXB is activated. By activating FXB, a transistor 73 operates to fix the potential of sWL to the ground potential. In this way the transistor QM is prevented from malfunction.

To set the memory cell C, FXB is deactivated and FXSET is activated, thereby increasing the FX potential to 1.0V. Next, PRE and TG are deactivated and thereafter DD is activated, entering a stand-by mode. As a result, the BL potential rises to VDD. Further, by driving MWL, the gate potential of the selection transistor QM increases from the ground potential to 1.0V. Consequently, current flows from the power supply 42 to the common line 41 through the phase change portion 11, whereby the phase change portion 11 is heated. Since a relatively low voltage of 1.0V is applied to the gate of the selection transistor QM, the source-drain resistance of the selection transistor QM becomes as high as 100 kΩ. However, since the resistance of the phase change portion 11 is 1 MΩ and is thus larger, the voltage VDD is substantially applied to the phase change portion 11, and as a result, the phase change portion 11 is heated. When the temperature of the phase change portion 11 reaches about 400° C., there occurs crystallization. Consequently, the resistance value of the phase change portion 11 decreases and the amount of current flowing through the phase change portion 11 increases. However, since the amount of current is limited by the selection transistor QM, the temperature of the phase change portion 11 does not reach the melting point thereof. Thus, it is possible to prevent re-amorphization and a stable setting operation can be effected. In 20 nsec after start-up of MWL, MWL and DD are deactivated, while TG and PRE are deactivated. Next, FXSET is deactivated and FXB is activated.

In the setting operation, by setting the gate voltage of the selection transistor QM lower than the gate voltage in the resetting operation, it was possible to prevent re-amorphization. Further, the following effects are obtained.

In the phase change memory, it is not that the phase change portion 11 undergoes a phase change uniformly. The smaller the energy used in the setting operation, the lower the crystallization ratio of the phase change portion 11. By limiting the amount of current flowing through the selection transistor QM, the resistance value in a low resistance state of the phase change portion 11 can be increased to a certain extent. By doing so, a less current is needed for generating the same energy in the phase change portion 11 and hence it is possible to decrease the amount of current required for the resetting operation. Consequently, the gate width of the selection transistor QM can be shortened and therefore it is possible to diminish the cell area.

Although the write voltage 42 is set at VDD, it goes without saying that an optimum value is selected in conformity with the structure and material of the phase change portion. Further, although in FIG. 1 the write voltage is set equal in both resetting operation and setting operation, there sometimes is the case where the use of different potentials is appropriate, depending on the type of chalcogenide used. It goes without saying that in this case it is appropriate to switch from one to another potential between the setting operation and the resetting operation.

Setting and resetting are performed together word by word. Of course, it is possible to perform setting or resetting cell by cell. By rewriting cell by cell, it is possible to suppress the generation of Joule's heat at a specific position. Of course, it is also possible to disperse the generation of heat by failure to arrange memory cells in logic address sequence.

Figure 6:
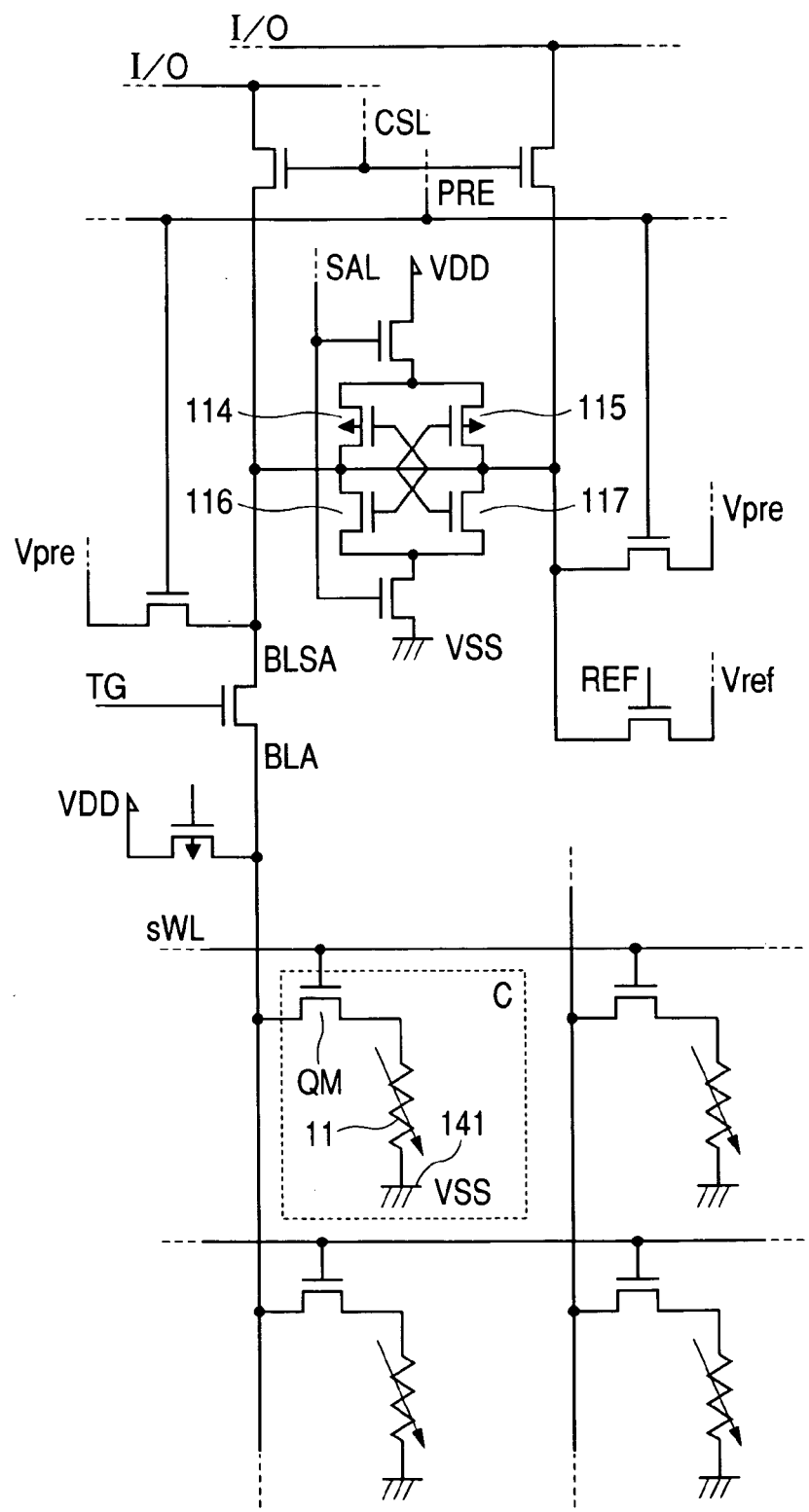
FIG. 6 shows the details of a sense amplifier circuit.
Figure 7:
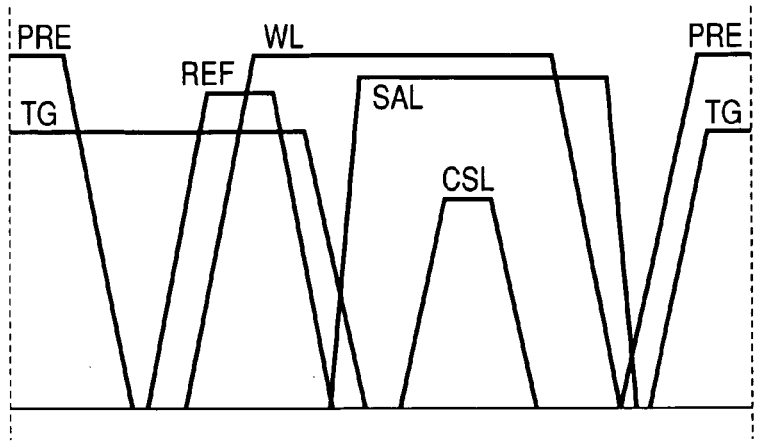
FIG. 7 shows potentials in "set" and "reset" states of a memory cell.
Figure 7:
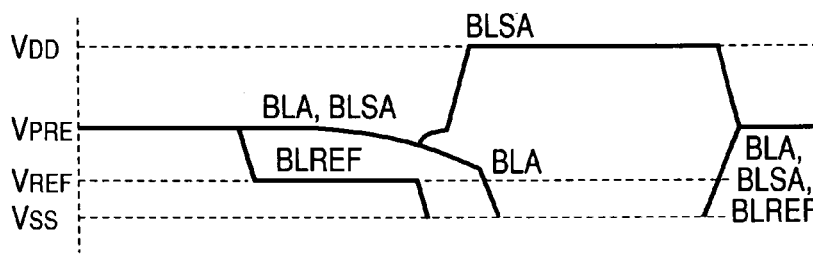
Figure 7:
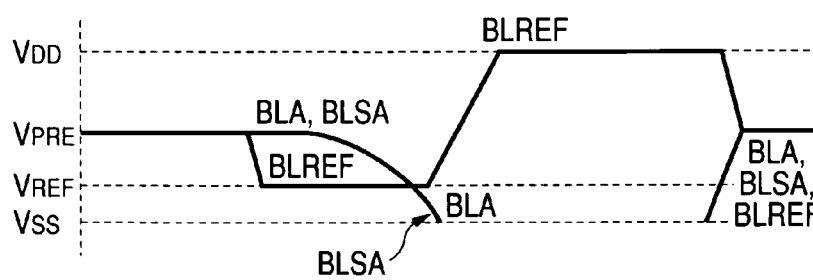

Next, a read-out operation will be described below in detail with reference to FIG. 6. In the same figure, a sense amplifier portion 53 in FIG. 1 is shown in detail.

Prior to the read-out operation, PRE and TG start up and the potential of BLSA and BLA are held at the precharge potential Vpre. The precharge potential Vpre is, for example, 0.5V. To read out information from the memory cell F, first PRE and TG are activated. Next, REF is activated to set the gate potential of transistors 114 and 116 at Vref. The reference voltage Vref is, for example, 0.2V. Thereafter, sWL is activated.

If the phase change portion is in a state of high resistance, the amount of current flowing through a common line 141 is very small and the potential of BLA and BLSA varies little in a period of time of 5 nsec. Therefore, a gate voltage higher than that of the transistors 114 and 116 is applied to transistors 115 and 117. Next, when TG is deactivated and SAL is activated, the difference in gate voltage between the transistors 114 and 115 and between the transistors 116 and 117 is amplified, so that the gate voltage of transistors 115 and 117 becomes almost equal to VDD and that of transistors 114 and 116 becomes almost equal to the ground potential VSS. Thereafter, CSL is activated and a potential in which the state of the phase change portion is reflected is transmitted to I/O line.

If the phase change portion is in a state of low resistance, the amount of current flowing through a common line 141 is very large and the potential of BLA and BLSA becomes almost equal to the ground potential VSS. Therefore, a gate voltage higher than that of the transistors 115, 117 is applied to the transistors 114, 116. Thereafter, TG is deactivated and SAL is activated, whereby the difference in gate voltage between the transistors 114 and 115 is amplified and the gate potential of transistors 115 and 117 becomes almost equal to VSS, while that of transistors 114 and 116 becomes almost equal to the supply voltage VDD. Thereafter, CSL is activated and a potential in which the state of the phase change portion is reflected is transmitted to I/O line. Information is read out in accordance with the above procedure.

The voltage, time, and the number of memory cells used are only examples and it goes without saying that their values are set at optimum values in accordance with the process technology node used for manufacture and applied products.

According to the present invention, it is possible to prevent erroneous resetting of the memory cell and therefore, irrespective of the state of the memory cell before rewrite, it is possible to realize direct write (direct overwrite) of an arbitrary value.

Further, since it is possible to implement a memory capable of stable rewrite, a mixed mounting with a highly reliable non-volatile memory can be realized.

Of course, a bipolar transistor can be used as the selection transistor QM. In this case, a high-speed memory can be implemented because the amount of current to be passed through the phase change portion can be taken large.

Figure 10:
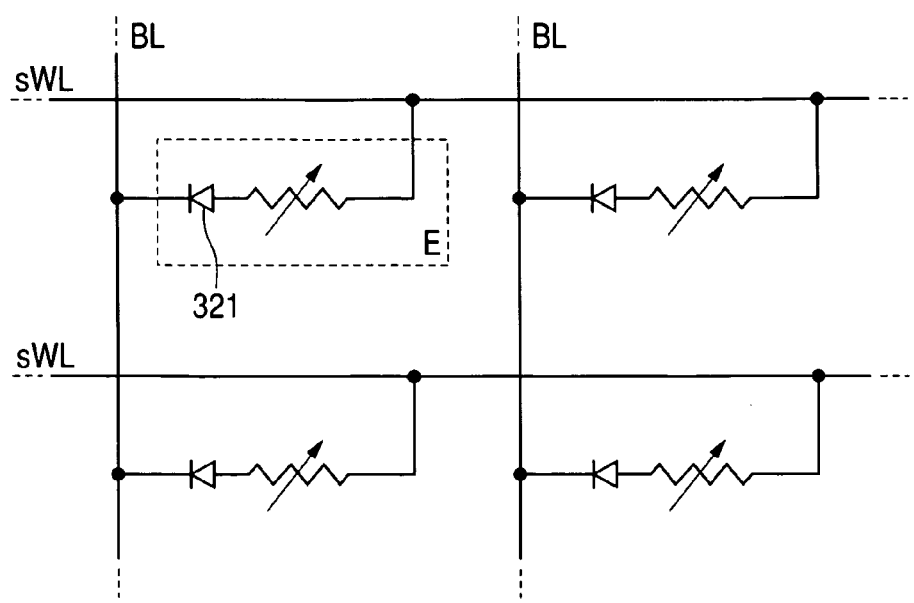
FIG. 10 shows a memory array using a memory cell comprising a junction and a phase change portion.

Instead of the selection transistor QM, pn junction may be used as a selection element. This memory array is shown in FIG. 10. A memory cell E comprises a pn junction and a phase change portion. Since it becomes unnecessary to use a transistor, the memory cell area can be diminished and hence it is possible to implement a large capacity memory. The direction of junction shown in FIG. 10 is a mere example and is changed according to purposes of use, of course.

Further, it goes without saying that a plate electrode may be used in place of a common line.

Second Embodiment

Figure 8:
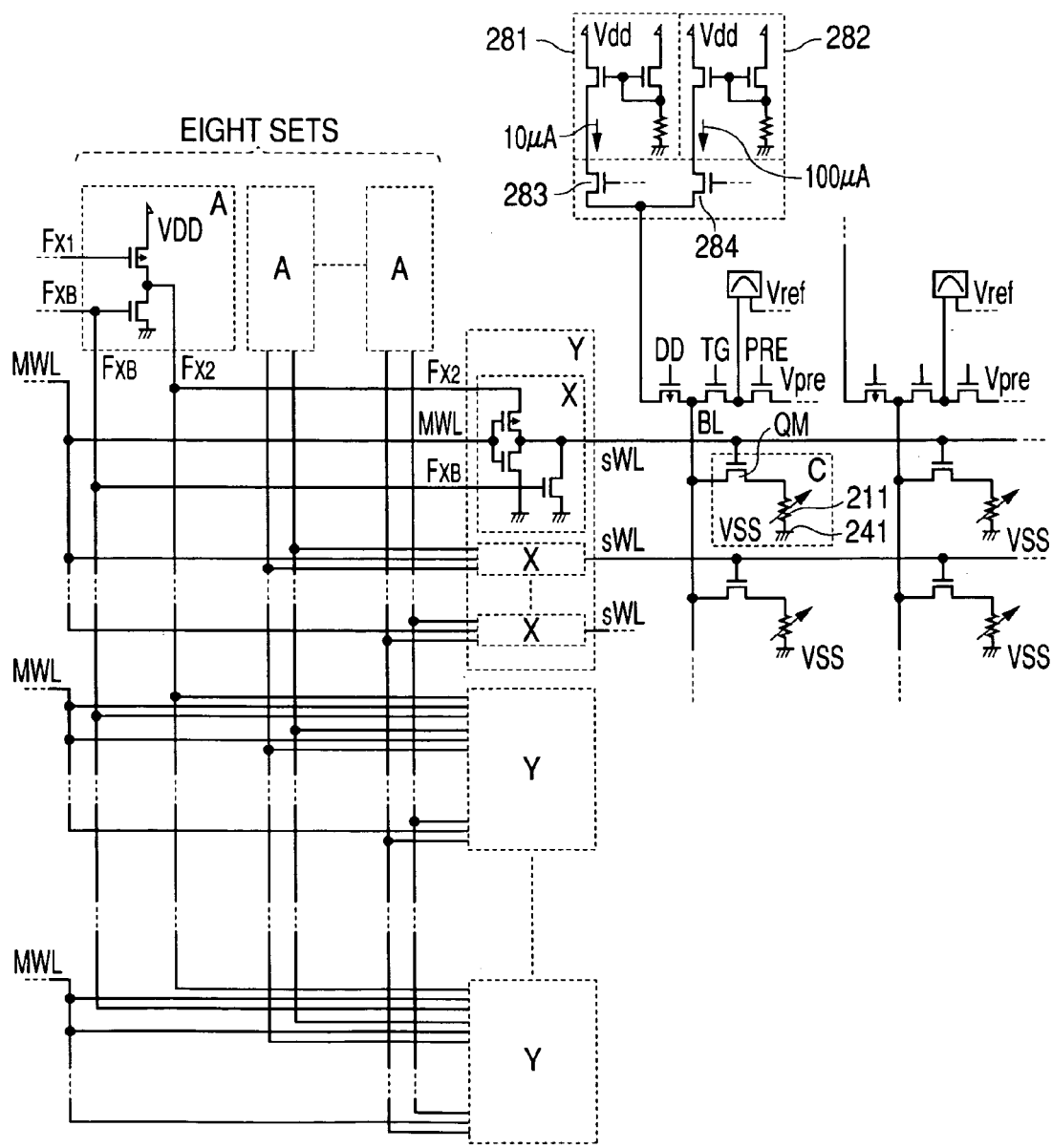
FIG. 8 shows a peripheral circuit portion using current mirror circuits and a memory array.

In this embodiment there is proposed a method using a circuit shown in FIG. 8 as a circuit which prevents re-amorphization and is thereby effective in stabilizing the setting operation. This circuit is characterized by comprising current mirror circuits 281 and 282. The current mirror circuit 281 can supply 10 µA current, while the current mirror circuit 282 can supply 100 µA current.

Before rewrite, FXB, TG, and PRE, are at an increased potential, while FX1, sWL, MWL, and DD, are at the ground potential VSS. The transistors 283 and 284 are OFF. BL is held at the precharge potential Vpre.

To reset the memory cell C, FXB, PRE, and TG, are deactivated, while FX1 and DD are activated. Next, the transistor 284 is turned ON. Then, MWL is activated to set the gate voltage of the selection transistor QM at VDD. With this operation, 100 µA current for heating the phase change portion 211 to above its melting point flows through the phase change portion.

Of course, a larger amount of current can be fed by turning ON the transistors 283 and 284 simultaneously.

To set the memory cell C, FXB, PRE, and TG are deactivated, while FX1 and DD are activated. Next, the transistor 283 is turned ON. Then, MWL is activated to set the gate voltage of the selection transistor QM at VDD. With this operation, 10 µA current flows through the phase change portion 211, but with such a degree of current, the phase change portion is heated to only 400° C. below the melting point thereof, and re-amorphization does not occur although crystallization occurs.

In this embodiment, the operating voltage of a peripheral circuit portion becomes high. However, the amount of rewrite current varies little due to variations in the selection transistor and thus there accrues an effect that variations between cells can be diminished.

Third Embodiment

In the first embodiment the phase change portion is disposed between the selection transistor and the ground potential, but in this third embodiment a selection transistor is disposed between a phase change portion and the ground potential.

Figure 9:
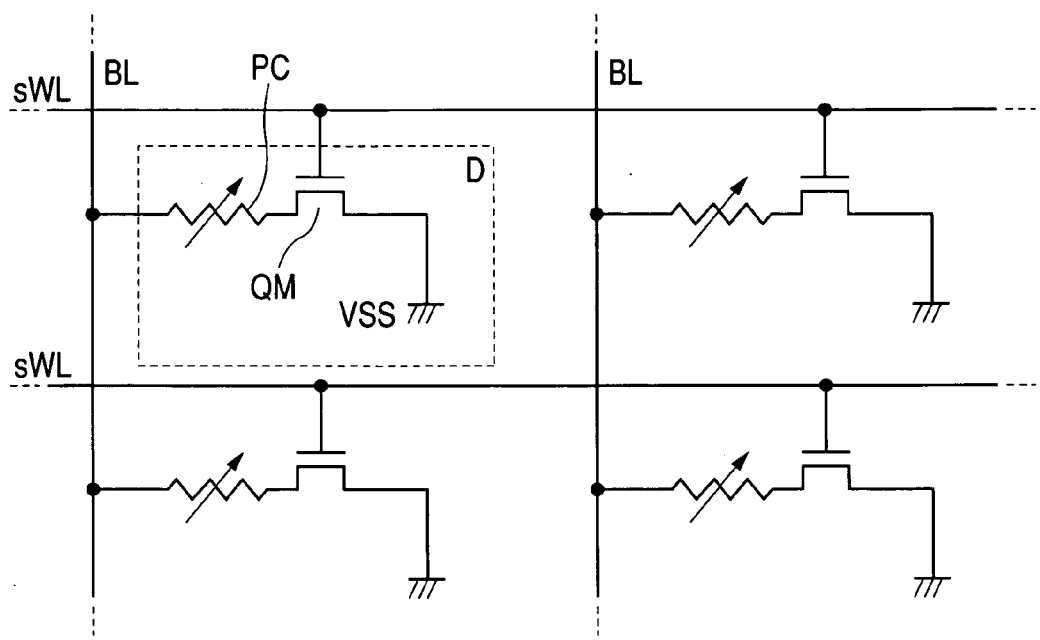
FIG. 9 shows a memory array using a memory cell of a structure in which a selection element is sandwiched in between a phase change portion and a ground potential.

A cell array of this embodiment is shown in FIG. 9. A peripheral circuit portion is the same as in the first embodiment. A memory cell D comprises a phase change portion PC and a selection transistor QM. In this embodiment, the bias potential of the selection transistor QM can be held at the common line potential VSS, so that a back bias is not imposed on the selection transistor QM and hence the selection transistor can be driven at a low voltage. Besides, since the common line can be laid without using a diffusion layer, the memory cell area can be diminished.

However, due to the wiring capacity, when the bit line potential varies, a slight amount of current flows also through the phase change portion of the memory cell with the word line OFF. This problem does not occur in the memory cell structure of the first embodiment.

Fourth Embodiment

Figure 11:
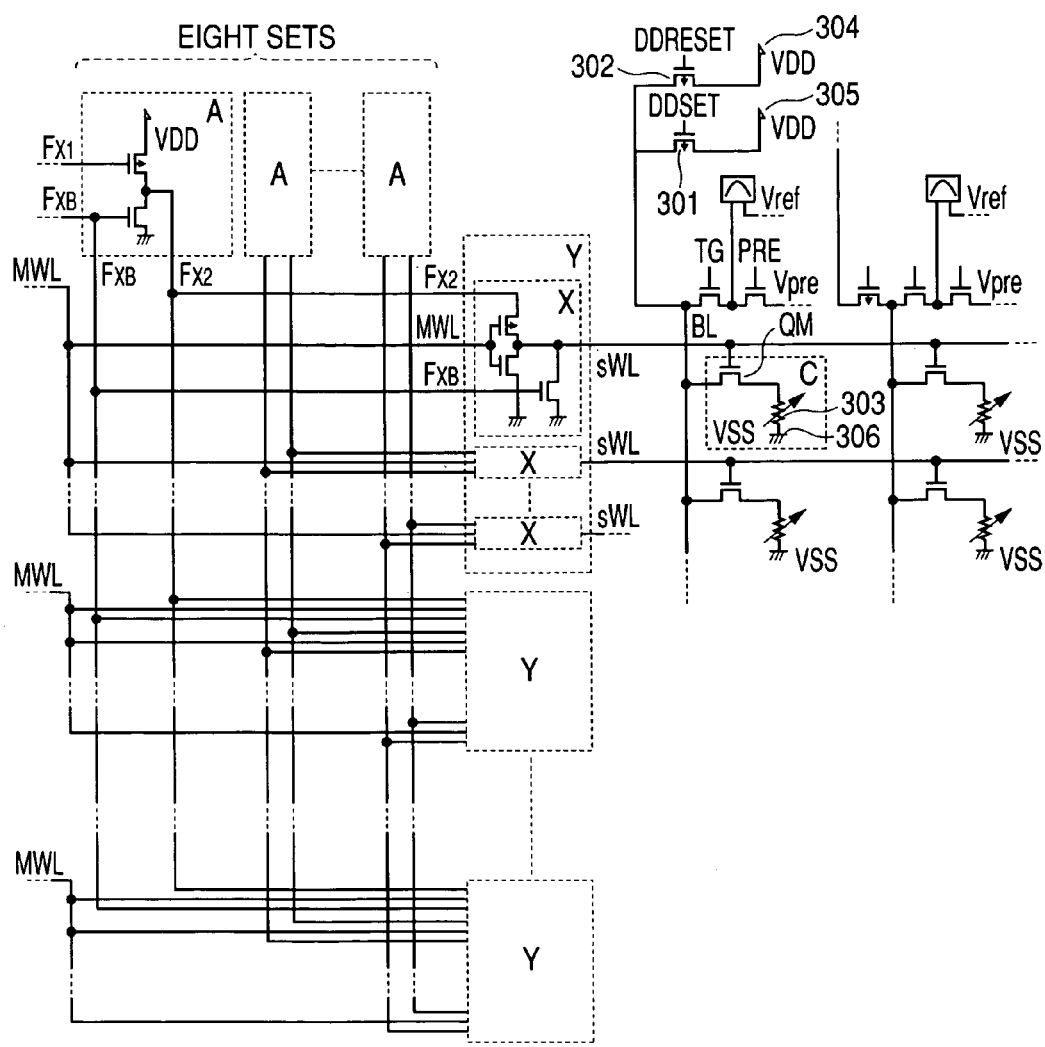
FIG. 11 shows a peripheral circuit which supplies current through transistors different in gate width between setting operating and resetting operation.

In the first embodiment the gate voltage of the selection transistor is subjected to a three-level control, but in this fourth embodiment a two-level control is performed. As shown in FIG. 11, plural power supplies 304 and 305 are connected to a bit line BL through transistors 301 and 302. The transistor 301 can handle a maximum of 10 μA current, while the transistor 302 can handle 100 μA current because it has a gate width ten times as large as that of the transistor 301.

When performing the setting operation, current is fed in the first embodiment by turning DD ON, while in this fourth embodiment DDSET is turned ON to supply current. According to this method, there flows only 10 μA current at most in the setting operation and therefore it is possible to prevent overheating of the phase change portion.

When performing the resetting operation, a sufficient current required for resetting can be fed by turning DDRESET ON.

Of course, the gate width of the transistor 301 and that of the transistor 302 are made equal to each other, but there may be adopted a method wherein in the setting operation the transistor 301 alone is turned ON, while in the resetting operation both transistors 301 and 302 are turned ON.

According to this embodiment, a stable setting operation can be attained even in a memory cell not having a selection transistor. Moreover, even if there are variations in characteristics of the selection transistor, the maximum amount of current flowing through the phase change portion does not vary, so that it is possible to improve the yield.

The gate width and current quantity used are mere examples. It goes without saying that those values are set at appropriate values in accordance with the process node.

Of course, the same effect as above can also be obtained by installing two series resistors of different values between the bit line BL and the power supplies instead of changing the gate width of transistors. The series resistors can be fabricated using polycrystalline silicon, single crystal silicon, amorphous silicon, TiN, Wn, or any of those materials with an impurity incorporated therein.

Fifth Embodiment

Figure 12:
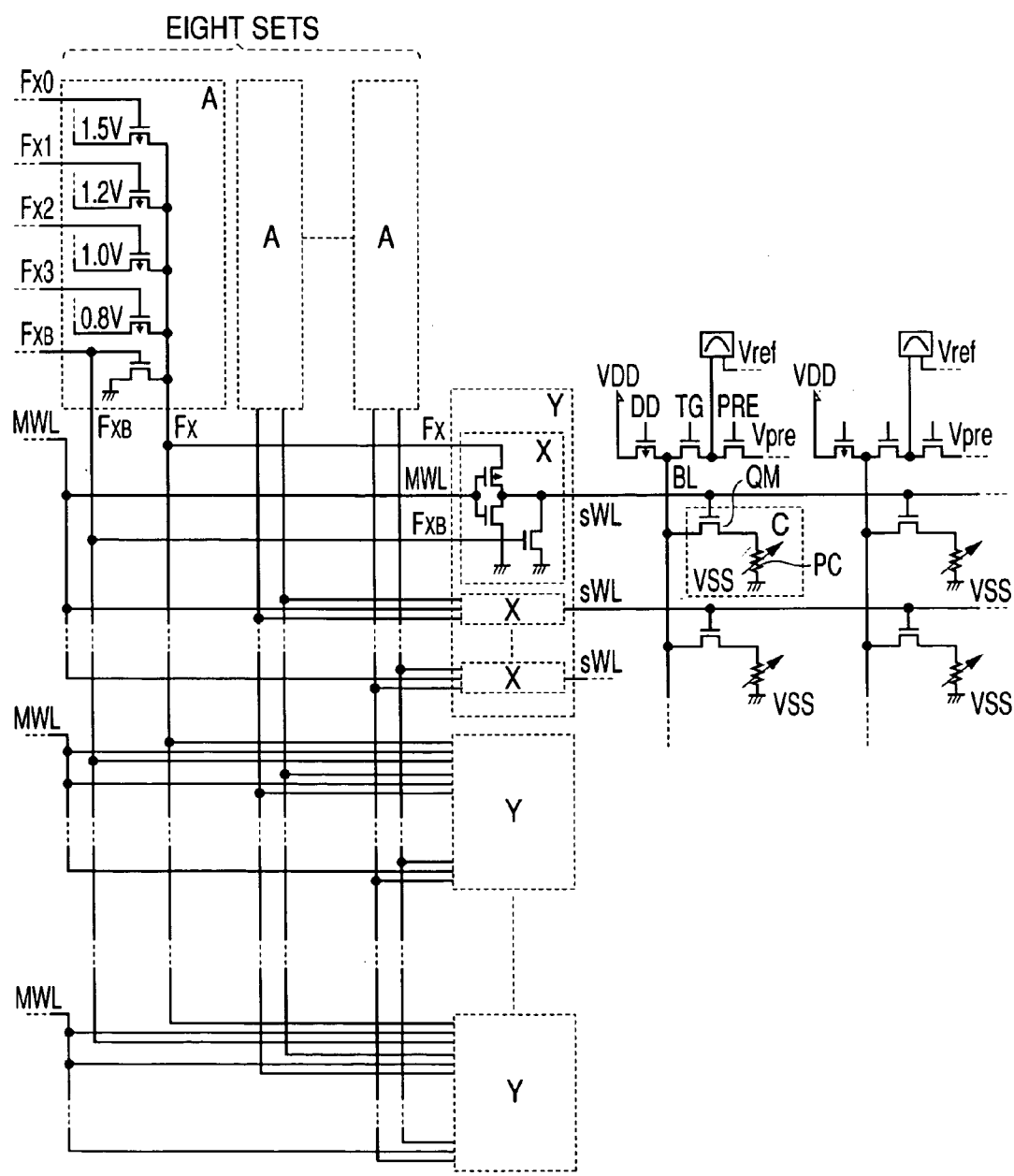
FIG. 12 shows a memory array and a peripheral circuit portion for implementing multi-level memorization.

In the first embodiment the gate voltage of the selection transistor is subjected to a three-level control, but in this fifth embodiment a four- or more-level control is performed, whereby it is possible to effect multi-level memorization. A circuit configuration used in this embodiment is shown in FIG. 12. The following description is now provided about a method of operation in case of recording four-level information in one memory cell.

For write of information 'O', FXB, PRE, and TG are deactivated, while FXO, DD, and MWL are activated. Since 1.5V is applied to the gate of transistor QM, current sufficient to heat a phase change portion PC to above the melting point of PC flows through the phase change portion, making the phase change portion amorphous. At this time, the resistance value of the phase change portion PC is 1 MΩ.

For write of information '1', '2', and '3', not FXO, but FX1, FX2, and FX3 are activated respectively. Gate voltages of the selection transistor QM become 1.2V, 1.0V, and 0.8V, respectively. Thus, different energies are generated in the phase change portion PC, but in all the cases the phase change portion PC is not heated to above its melting point nor does it become amorphous. As described in the first embodiment, the ratio of crystallization of the phase change portion PC depends on the energy used in the setting operation, so that resistance values of the phase change portion PC become 10 kΩ, 30 kΩ, and 100 kΩ, respectively.

In this way, a stable multi-level memorization is attained by writing four-level information into a single phase change portion PC.

Of course, the write of information can be done more positively by performing the resetting operation without fail prior to write. Also by checking the resistance of the phase change portion beforehand and performing the rewrite operation as necessary, it is possible to effect the write of information more positively.

Since the resistance value of the phase change portion PC can take a value over a wide range of 10 kΩ to 1 MΩ, sixteen-level information can be stored for each memory cell.

The following is an explanation of reference numerals used in the drawings.

PC, 1, 2, 11, 211, 303 . . . storage element
QM . . . selection transistor
C, D, E, F . . . memory cell
sWL . . . sub-word line
MWL . . . main word line
BL . . . bit line
I/O . . . I/O line
PRE . . . Precharge Enable signal
DD . . . Power Enable signal
DDRESET . . . Reset Enable signal
DDSET . . . Set Enable signal
TG . . . Bit Line Enable signal
SAL . . . Simplification Enable signal
CSL . . . Data Output Enable signal
REF . . . Reference Voltage Enable signal
VDD, 304, 305 . . . supply voltage
VSS . . . ground voltage
Vpre . . . precharge voltage
Vref . . . reference voltage
Tm . . . melting point
Tc . . . crystallization temperature
t1, t3 . . . cooling time
t2 . . . temperature holding time
t4 . . . crystallization time
FX . . . sub-word line selection line
FXB . . . sub-word line second selection line
A . . . sub-word line selection circuit
Y . . . sub-word line driver
X . . . sub-word line driver partial circuit
FX1 . . . sub-word line selection line 1
FX2 . . . sub-word line selection line 2
30, 73, 114, 115, 116, 117, 301, 302 . . . transistor
42 . . . supply voltage of a specific bit line
53 . . . sense amplifier
41, 141, 241, 306 . . . ground voltage of a specific memory cell
281, 282 . . . current mirror circuit
283, 284 . . . operation selection transistor

What is claimed is:

1. A semiconductor memory comprising:
a plurality of word lines;
a plurality of bit lines intersecting the word lines; and
a plurality memory cells, provided at respective intersecting points of the word lines and the bit lines, each including an information storage portion and a selection element, the information storage portion including a phase change material;

wherein, using the selection element for the storage of different resistance values in the information storage portion, current flowing through the selection element is controlled such that, in a resetting operation, said phase change material is reset to a first resistance state and, in a setting operation, said phase change material is set to a second resistance state of lower resistance than said first resistance state by a current which is limited so as to avoid resetting of the phase change material.

2. The semiconductor memory according to claim 1, wherein the information storage portion is a laminate, the laminate comprising a first electrode layer, a layer of the phase change material, and a second electrode layer.

3. The semiconductor memory according to claim 2, wherein the phase change material contains at least Te.

4. The semiconductor memory according to claim 1, wherein the selection element is an MIS type transistor.

5. The semiconductor memory according to claim 1, wherein the selection element is a bipolar transistor.

6. The semiconductor memory according to claim 1, wherein the selection element comprises a junction.

7. The semiconductor memory according to claim 1, wherein the information storage portion is disposed between an earth electrode and the selection element.

8. The semiconductor memory according to claim 1, wherein the selection element is disposed between an earth electrode and the information storage portion.

9. The semiconductor memory according to claim 1, wherein a word voltage connected to the selection element is controlled by a three-level control to control the current flowing through the selection element.

10. The semiconductor memory according to claim 9, wherein the information storage portion is a laminate, the laminate comprising a first electrode layer, a layer of the phase change material, and a second electrode layer.

11. The semiconductor memory according to claim 10, wherein change material contains at least Te.

12. The semiconductor memory according to claim 9, wherein the selection element is an MIS type transistor.

13. The semiconductor memory according to claim 9, wherein the selection element is a bipolar transistor.

14. The semiconductor memory according to claim 9, wherein the selection element comprises a junction.

15. The semiconductor memory according to claim 9, wherein the information storage portion is disposed between an earth electrode and the selection element.

16. The semiconductor memory according to claim 9, wherein the selection element is disposed between an earth electrode and the information storage portion.

17. The semiconductor memory according to claim 1, further comprising current mirror circuits each connected to bit line connected to the selection element to control the current flowing through the selection element.

18. The semiconductor memory according to claim 1, wherein a plurality of power supplies are connected to bit line connected to the selection element to control the current flowing through the selection element, and selection is made from the plurality of the supplies according to information to be stored.

19. The semiconductor memory according to claim 1, wherein a word voltage connected to the selection element is controlled to a value in a range from 4- to 17-level value to control the current flowing through the selection element.

20. The semiconductor memory according to claim 1, mounted on a microcomputer.

21. A semiconductor memory comprising:

a memory cell having an information storage portion including a phase change material of which a ratio of crystallization can be changed by heating; and control circuitry operative to control current flow in the memory cell to change the ratio of crystallization and thereby change information stored by the memory cell;

wherein, in a resetting operation, the control circuitry causes a first current to flow in the memory cell to heat the phase change material above a melting point thereof, and wherein, in a setting operation, the control circuitry causes a second current to flow in the memory cell to increase the crystallization ratio of the phase change material, the second current being less than the first current and being limited so as to avoid heating the phase change material above its melting point.

22. A memory according to claim 21, wherein the memory cell includes a selection element, and the control circuitry controls current flow through the selection element.

23. The semiconductor memory according to claim 22, wherein the selection element is an MIS type transistor.

24. The semiconductor memory according to claim 22, wherein the selection element is a bipolar transistor.

25. The semiconductor memory according to claim 22, wherein the selection element comprises a junction.

26. A semiconductor memory according to claim 22, wherein the information storage portion is disposed between an earth electrode and the selection element.

27. A semiconductor memory according to claim 22, wherein the selection element is disposed between an earth electrode and the information storage portion.

28. A semiconductor memory according to claim 21, wherein the information storage portion is a laminate, the laminate comprising a first electrode layer, a layer of the phase change material, and a second electrode layer.

29. A semiconductor memory according to claim 28, wherein the phase change material contains at least Te.

30. A semiconductor memory according to claim 21, wherein the second current is one of a plurality of selectable currents which are less than the first current and different from one another, such that information of a plurality of bits can be stored in the information storage part of the memory cell.

* * * * *